US012744529B2

(12) United States Patent
Wang et al.

(10) Patent No.: US 12,744,529 B2
(45) Date of Patent: Sep. 22, 2026

(54) LOW LEAKAGE MULTIPLEXER

(71) Applicant: Apple Inc., Cupertino, CA (US)

(72) Inventors: Ziyan Wang, Sunnyvale, CA (US); Saikrishna Ganta, Fremont, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 18/820,941

(22) Filed: Aug. 30, 2024

(65) Prior Publication Data

US 2026/0066900 A1 Mar. 5, 2026

(51) Int. Cl.
*H03K 17/693* (2006.01)
*H03K 17/687* (2006.01)

(52) U.S. Cl.
CPC ....... *H03K 17/693* (2013.01); *H03K 17/6871* (2013.01); *H03K 2217/0054* (2013.01)

(58) Field of Classification Search
CPC ............. H03K 17/693; H03K 17/3871; H03K 2217/0054
USPC .................................................. 327/436, 437
See application file for complete search history.

(56) References Cited

U.S. PATENT DOCUMENTS 4,544,854 A * 10/1985 Ulmer ................ H03K 17/6872 327/388
2004/0139376 A1* 7/2004 Ohta ...................... H10D 89/10 714/724
2005/0052204 A1 3/2005 Chun
2014/0126277 A1 5/2014 Deng et al.
2015/0381160 A1 12/2015 Draxelmayr
2023/0198550 A1 6/2023 Wang et al.
2024/0097686 A1 3/2024 Mai et al.

FOREIGN PATENT DOCUMENTS

| | | | |
|---|---|---|---|
| DE | 3919053 | A1 | 12/1990 |
| DE | 102013022381 | B3 | 9/2020 |
| DE | 102022119802 | B3 | 11/2023 |
| EP | 1607852 | B1 | 6/2014 |
| KR | 102015069838 | A | 6/2015 |
| WO | 2024015023 | A2 | 1/2024 |

* cited by examiner

*Primary Examiner* — Menatoallah Youssef
*Assistant Examiner* — Colleen J O'Toole
(74) *Attorney, Agent, or Firm* — DICKINSON WRIGHT RLLP

(57) ABSTRACT

A multiplexer circuit includes a plurality of switch circuits coupled between respective input nodes and an output node. The switch circuits include first and second switch elements coupled in series, at an intermediate node, between the respective input node and the output node. A third switch element is coupled between an output of a buffer and the intermediate node. The buffer is configured to generate a buffered voltage based on the output voltage. When a particular switch circuit is selected, its respective first and second switch elements are active while its third switch element is inactive, resulting in a path between its input node and the output node. When the particular switch circuit is not selected, its third switch element is active while its first and second switch elements are inactive. The buffered voltage is driven to the intermediate node via the active third switch element.

20 Claims, 10 Drawing Sheets

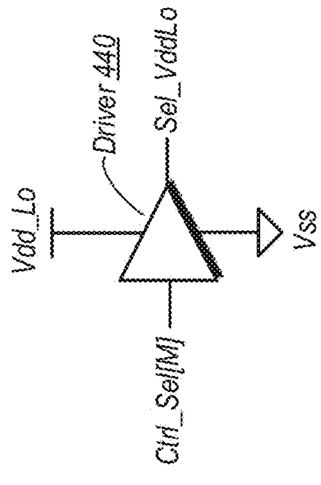
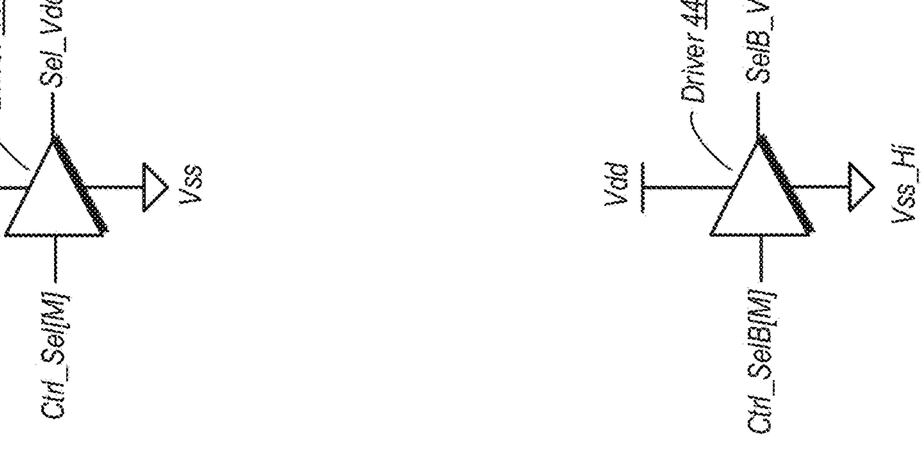
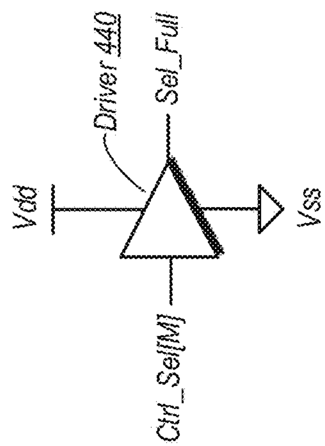
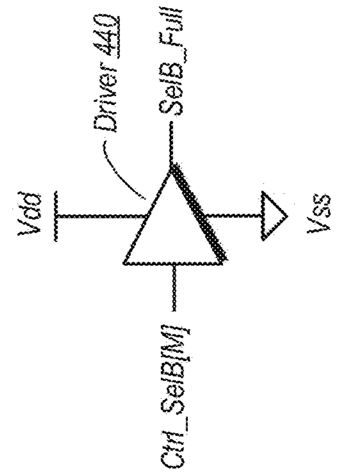
Fig. 4
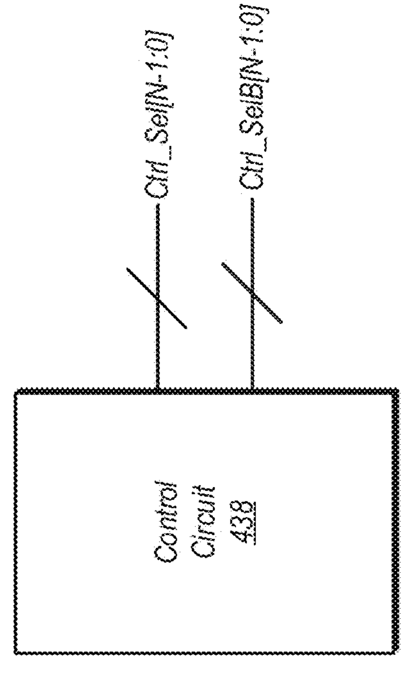

LOW LEAKAGE MULTIPLEXER

FIELD

The described embodiments relate generally to electronic circuits, and more particularly, to selection circuits.

BACKGROUND

Multiplexers are widely used in electronic systems having multiple functional circuits. A multiplexer may be used to select, as an output signal, one of several different input signals. Multiplexers may be implemented in different forms. For example, a digital multiplexer may use various logic circuits to select an input signal to be provided to the output based on an input code having a number of bits that is based on the number of selectable inputs. Another type of multiplexer is a one-hot multiplexer, which may be used with analog and mixed-signal circuits. In a one-hot multiplexer, a single input circuit may be selected, by an external circuit, to convey an input signal to the multiplexer output, while the others may remain unselected.

BRIEF DESCRIPTION OF THE DRAWINGS

FIG. 4 is a diagram illustrating a control circuit and driver circuitry usable to convey selection signals to a multiplexer according to the disclosure.

DETAILED DESCRIPTION

Figure 1:
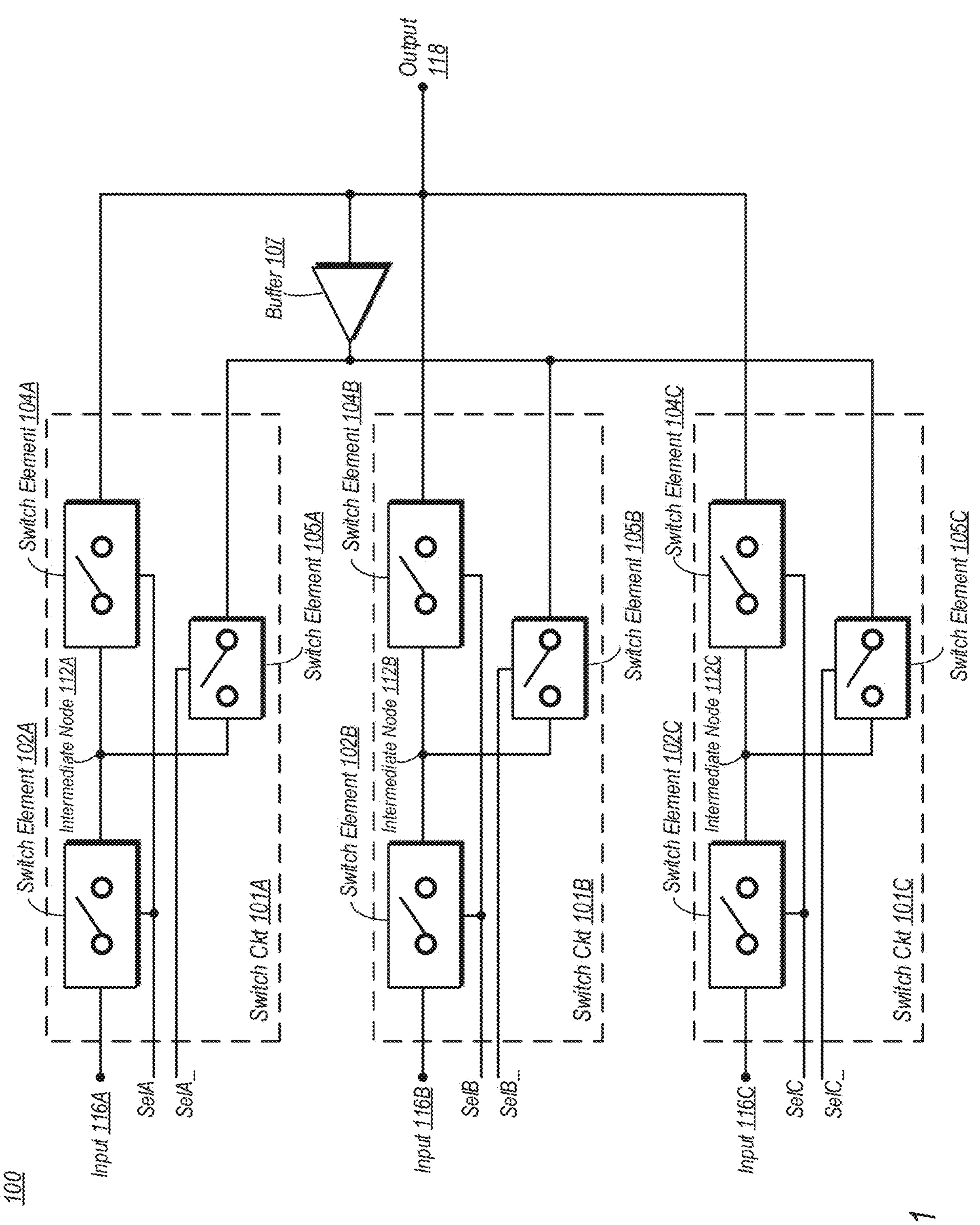
FIG. 1 is a schematic diagram of one embodiment of a multiplexer according to the disclosure.

Many integrated circuits (ICs) include mixed signal circuitry, and thus, analog circuits. Some of these analog circuits may generate signals that are to be evaluated by circuitry and/or systems external to an IC. However, as the density of ICs has increase, there is increasing competition among circuits thereon for access to a limited number of external pins. Accordingly, to provide access to more circuits within the IC, multiplexers may be implemented in which a single output pin can be used to convey signals from one of several different circuits, depending on a selection at a given time.

Analog multiplexers may utilize circuits such as pass gates (which may also be referred to as transmission gates) to select one of a number of different analog signals as a multiplexer output signal. These pass gates, often implemented with both an NMOS device and a PMOS device, may be subject to leakage between their respective drain and source terminals. Such leakage can result in errors in, e.g., the voltage of an output signal, as this voltage is affected by unwanted leakage from unselected portions of the multiplexer.

The present disclosure utilizes the insight that, if two pass gates in a switch circuit of a multiplexer were connected in series and the output voltage from the selected signal could be transferred onto an intermediate node between the two pass gates of the unselected switch circuits, the undesired leakage could be minimized if not eliminated altogether. Accordingly, the present disclosure is directed to an analog multiplexer having a plurality of switch circuits and a buffer circuit. Each of the switch circuits includes first and second switch elements (e.g., pass gates) coupled in series between a respective input and the output of the multiplexer. The first and second switch elements of each switch circuit are coupled to one another at an intermediate node. A buffer includes an input coupled to the output node of the multiplexer. Each of the switch circuits includes a third switch element coupled between an output of the buffer and its respective intermediate node. When a particular switch element is selected to provide an input signal to the output node, its respective first and second switch elements are activated while its third switch element remains inactive. For an unselected switch element, its third switch element is activated, while its first and second switch elements are inactive. When the third switch element of a particular switch circuit is active, a voltage present on the output of the multiplexer is driven to its intermediate node. With the output voltage driven to the respective intermediate nodes of each of the unselected switch circuits, leakage (e.g., drain-to-source leakage) that could pass through the switch elements and adversely affect the voltage on the output node of the multiplexer is mitigated or effectively eliminated. Accordingly, the voltage of the input signal received by the selected switch circuit may be more accurately reflected on the output node of the multiplexer.

Various embodiments of a multiplexer, circuits used therein or therewith, applications, and methods of operating are now described in further detail.

Multiplexer and Example Switch Circuit:

FIG. 1 is a diagram of one embodiment of a multiplexer according to the disclosure. In the embodiment shown, multiplexer 100 includes a plurality of switch circuits 101 (e.g., 101A, 101B, and 101C in this example). The number of switch circuits in a given embodiment may vary from one embodiment to the next, and thus the particular number shown here is provided as one possible example. Each switch circuit 101 includes an input 116. An output of each switch circuit 101 is coupled to a shared output 118, via which the output signal from the selected switch circuit 101 is provided.

Each switch circuit 101 in the embodiment shown includes three switch elements. For example, switch circuit 101A includes switch elements 102A, 104A, and 105A (generally, 102, 104, and 105 hereinafter), while the other switch circuits 101 are similarly arranged. Switch elements 102 and 104 are coupled in series between the input 116 of the respective switch circuit and multiplexer output 118. The junction between switch elements 102 and 104 is referred to as intermediate node 112. When the corresponding switch circuit 101 is selected to provide the its respectively received input signal as an output signal from multiplexer 100, both switch elements 102 and 104 are closed to enable a signal path between input 116 and output 118. Selection signals are received via a selection signal input, Sel (e.g., SelA for switch circuit 101A, etc.) that, when asserted, activates switch elements 102 and 104. In some embodiments, multiple signal paths may be concurrently enabled when their corresponding selection signals are asserted. However, embodiments which operate as a one-hot multiplexer are also possible and contemplated.

The third switch element 105 in each of switch circuits 101 is coupled between a buffer 107 and the respective intermediate node 112. Buffer 107 in the embodiment shown is configured to generate a buffered voltage that is based on the voltage of the signal provided to output 118. Accordingly buffer 107 includes at least one input coupled to output node 118. Each of the switch elements 105 of the various switch circuits 101 is coupled to receive the buffered voltage. Additionally, each of the switch elements 105 is configured to be activated by a complement of the selection signal provided to its corresponding switch circuit 101. For example, whereas switch elements 102A and 102B of switch circuit 101A are activated by assertion of a select signal SelA, switch element 105A is activated by the complement, SelA_, of this select signal.

During the selection process, one of switch circuits 101 is selected to provide its respectively received input signal to output node 118. In particularly, the switch elements 102 and 104 of the selected switch circuit 101 are activated to provide a path between the respective input node 116 and the multiplexer output node 118. Concurrently, switch element 105 of the selected switch circuit is inactive, thereby blocking the output from buffer 107 from the input node 112 of the selected switch circuit. For the remaining switch circuits 101, their respective switch elements 102 and 104 are inactive, while their respective switch elements 105 are active. Accordingly, for each the unselected ones of switch circuits 101, the buffered voltage from buffer 107 is driven through their respective switch elements 105 to their respective intermediate nodes 112. In this manner, leakage that could affect the voltage of the signal on output node 118 may be effectively eliminated. Accordingly, the voltage of the output signal is largely unaffected, if at all.

Figure 2:
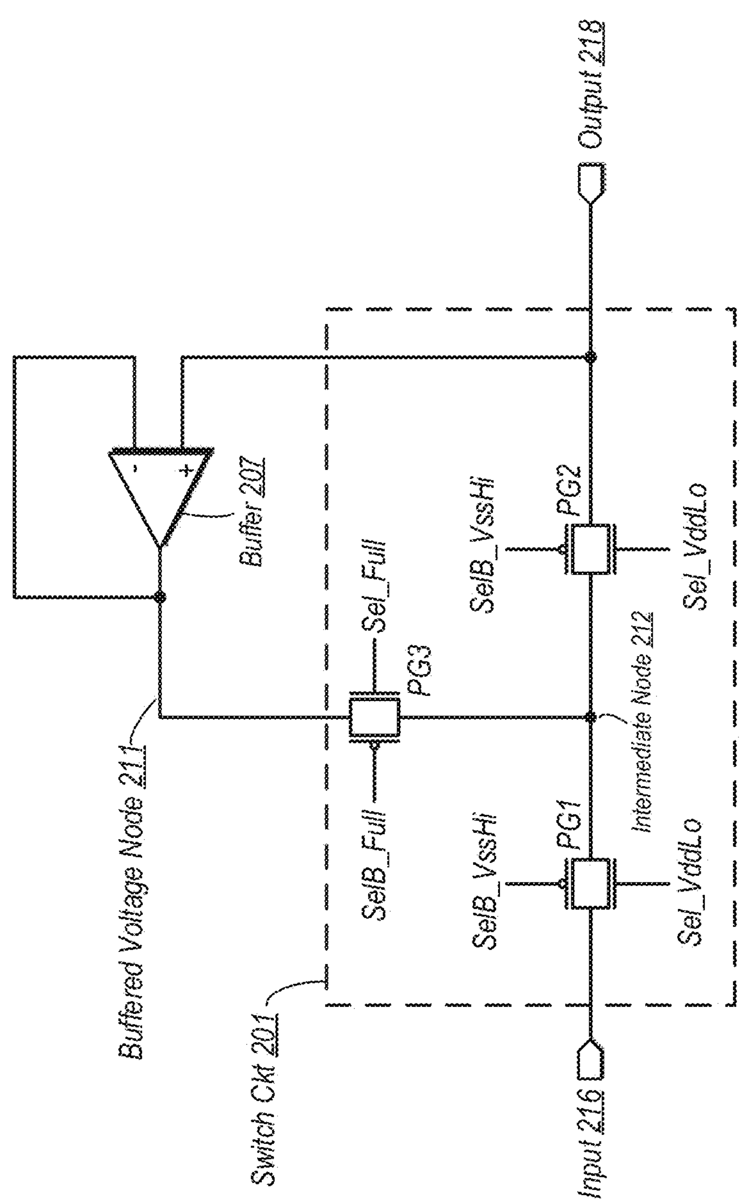
FIG. 2 is a schematic diagram illustrating one embodiment of a switch circuit usable in a multiplexer according to the disclosure.

FIG. 2 is a schematic diagram of one embodiment of a switch circuit usable in a multiplexer per the present disclosure. In the embodiment shown switch circuit 201 includes an input node 216 which is coupled to an output node 218 that is shared by other switch circuits 101 of a multiplexer. Switch circuit 201 includes switch elements implemented as a first pass gate PG1, a second pass gate PG2, and a third pass gate PG3. Each of the pass gates in the embodiment shown is implemented using a PMOS device and an NMOS device, although other pass gate configurations are possible and contemplated.

Pass gates PG1 and PG2 are coupled in series between input node 216 and output node 218, with both pass gates coupled to intermediate node 212. When switch circuit 201 is selected, both pass gates PG1 and PG2 are active (while PG3 is inactive), thereby creating a signal path between input 216 and output 218. When selected, both pass gates PG1 and PG2 receive selection signals Sel_VddLo on their respective NMOS devices, while a logically complementary signal SelB_VssHi, is provided to their respective PMOS devices. This results in activation of both the NMOS and PMOS device for each of pass gates PG1 and PG2, thereby enabling the signal path. During the time that pass gates PG1 and PG2 are activated, pass gate PG3 is inactive, which prevents the formation of a positive feedback loop.

When switch circuit 201 is not selected, both PG1 and PG2 are inactive (thereby blocking the signal path between the input node 216 and output node 218), while PG3 is activated. The activation of PG3 is in response to the signals SelB_Full (on the gate of the PMOS device) and Sel_Full (on the gate of the NMOS device). When PG3 is active, a signal path is created between buffered voltage node 211 and intermediate node 212. Buffered voltage node 211, in the embodiment shown is coupled to the output of buffer 207. Buffer 207, as shown here, includes a non-inverting input coupled to the output node 218 and an inverting input that is coupled via a feedback path directly to buffered voltage node 211. In this configuration, buffer 207 generates, on the buffered voltage node 211, a voltage that is substantially equivalent to the output signal on output node 218. This voltage is driven to the respective intermediate nodes 212 of all unselected switch circuits 201. As a result, for all unselected instances of switch circuit 201, the voltage on their respective intermediate node 212 is substantially the same as that on output node 218 (e.g., drain-to-source voltages are substantially zero) even though passgate PG2 is inactive. By equalizing the voltage on these nodes, leakage through PG2 may be largely or completely eliminated. Accordingly, the voltage on the output node 218 will thus reflect the voltage of the input signal for the selected one of switch circuits 218.

It is noted that the selection signal and complement provided to the devices of PG1 and PG2 are signals having a lower voltage swing than the full Vdd-Vss signals SelB_Full and Sel_Full. The generation of these signals is discussed further below in reference to FIGS. 3 and 4.

Figure 3:
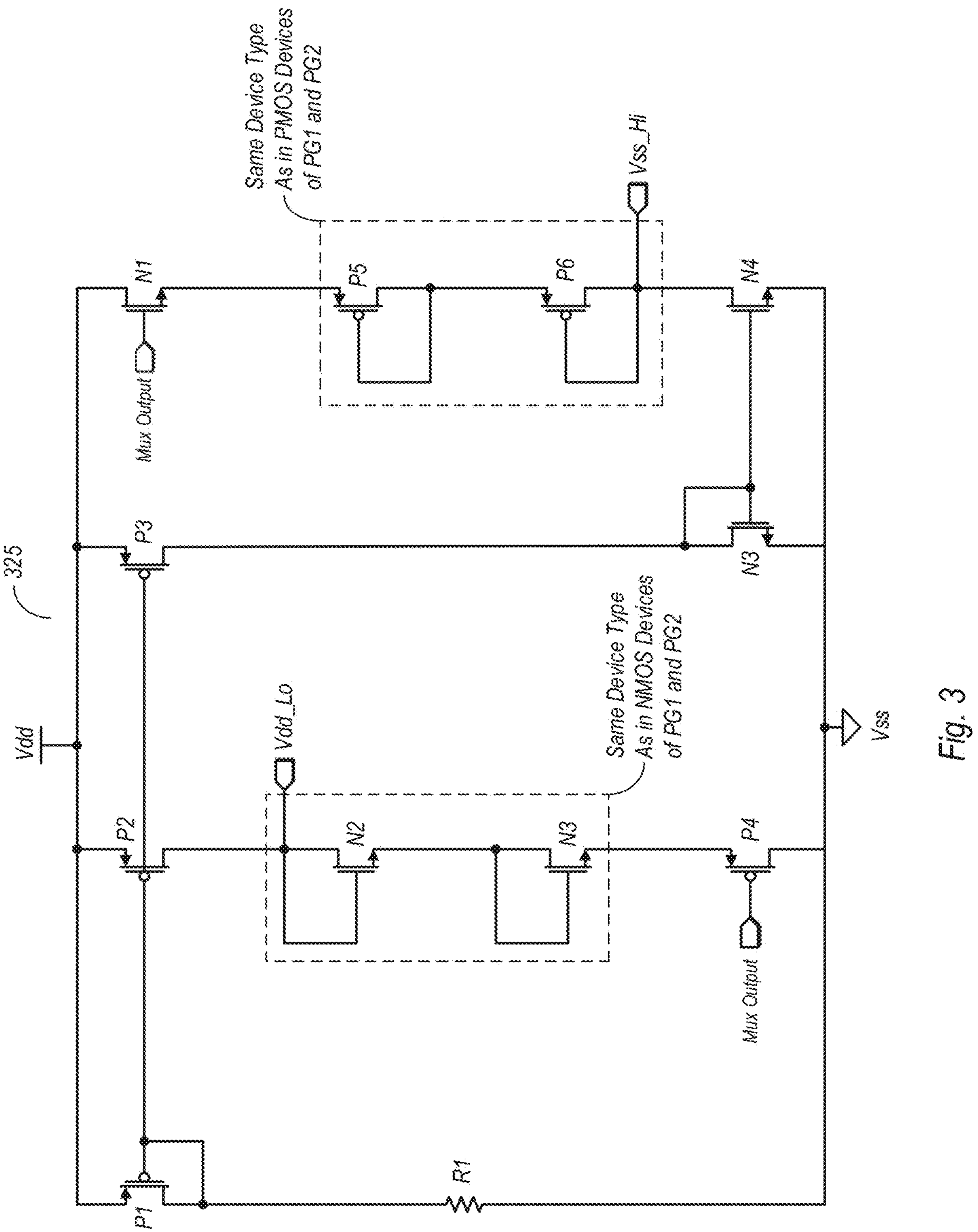
FIG. 3 is a schematic diagram illustrating a level-shifter circuit usable with a multiplexer according to the disclosure.

Multiplexer Control/Selection Signals and Voltages:

FIG. 3 is a schematic diagram of one embodiment of a level shifter circuit. In the embodiment shown, level shifter 325 may be used to generate supply voltages upon which certain selection signals are based. For example, the supply voltages may be provided to driver/buffer circuits that output the selection signals to the various switch circuits.

In the embodiment shown, level shifter 325 is configured to receive supply voltages Vdd and Vss and, based thereon, generate supply voltages Vdd_Lo and Vss_Hi. The voltage difference (swing) between Vdd_Lo and Vss_Hi may be less than the voltage difference between Vdd and Vss in most operating conditions. Additionally, it is further noted that the generation of supply voltages Vdd_Lo and Vss_Hi is partly based on the voltage of the multiplexer output signal, which is input into level shifter as the input signal Mux Output.

Level shifter 325 in the embodiment shown includes a first current mirror that includes devices P1 (which is diode-connected) along with P2 and P3. A second current mirror is implemented using N3 (diode-connected) and N4, and is partially dependent on operation of the first current mirror via the current that is mirrored to device P3. Both of these current mirrors draw a mirrored current through a correspondingly coupled circuit branch that includes a pair of diode-coupled devices via which the output voltages, Vdd_Lo and Vss_Hi are generated.

Device P2 is coupled in series with two diode-coupled NMOS devices, N2 and N3, which are further coupled to PMOS device P4. The two diode-coupled NMOS devices N2 and N3 are of a same types as the NMOS devices of pass gates PG1 and PG2 in each of the switch circuits. That is, N2 and N3 may have the same gate width and length and other characteristics that are the same as those of the NMOS pass gate devices PG1 and PG2. By using devices with the same characteristics, the on-resistance of each device may remain stable over variations in process, voltage, and temperature.

The output voltage Vdd_Lo is generated by the stack of two diode-connected NMOS devices and the common drain PMOS device P4 that senses, via its gate terminal, the voltage on output of the multiplexer, Mux Output. With the current provided by the PMOS current mirror, this circuit arrangement creates (on the drain of N2) the voltage Vdd_Lo. The voltage Vdd_Lo produced in this arrangement is lower than that of Vdd when the voltage of Mux Output is low, and increases as the voltage of Mux Output increases until saturating at Vdd.

The voltage Vss_Hi may be generated in a manner similar to that used to generate Vdd_Lo. The common drain NMOS device N1 senses the voltage of Mux Output, while current is supplied in the corresponding circuit branch by the current mirrored to NMOS device N4. The current passes through the diode-coupled PMOS devices P5 and P6. The voltage Vss_Hi is produced on the drain terminal of P6, and has a value that is greater than Vss when the voltage of Mux Output is high. As the voltage of Mux Output falls, the voltage of Vss_Out also falls until it saturates at Vss.

As will be further discussed in reference to FIG. 4, the voltages Vdd_Lo and Vss_Hi are provided as supply voltages to driver/buffer circuits that generate selection signals driven to the pass gates in the signal path (e.g., PG1 and PG2 of FIG. 2) in each of the switch circuits for one embodiment. Driving the pass gates in this manner may further lower the possibility of gate leakage while maintaining the on-resistance of these pass gates at a constant value.

The design of level shifter 325 shown here may, in various embodiments, be tunable and extendable to other process technologies. Depending on the supply voltage, transistor threshold voltage, and other technology parameters, the number of stacked diode-connected devices and the size of each diode-connected device may be adjusted to achieve the desired on-resistance and gate leakage characteristic.

FIG. 4 is a diagram illustrating a control circuit and driver circuitry usable to convey selection signals to a multiplexer according to the disclosure. In the illustrated example, control circuit 438 is configured to generate selection signals Ctrl_Sel[N−1:0} and corresponding complement signals Ctrl_SelB[N−1:0] that are provided to various ones of the driver circuits 440 shown here. It is noted that the number of driver circuits 440 shown here is illustrated, while the actual number in a given embodiment may correspond to the number of switch circuits implemented therein. The generation of control signals by control circuit 438 may be such that the multiplexer of the present disclosure operates as a one-hot multiplexer in some embodiments, or operates as a more traditional multiplexer in other embodiments.

As shown in the drawing, some of the drivers 440 receive the supply voltages Vdd and Vss, and thus are configured to generate full voltage swing selection signals based on their respective input signal (Ctrl_Sel[M] or the complement Ctrl_SelB[M]). The upper left driver 440 in the example shown, based on the full swing of Vdd-Vss, generates the Sel_Full signal, while the lower left driver 440 generates the SelB_Full signal. The Sel_Full and SelB_Full signals are provided to the PG3 pass gates coupled between the buffer output and respective intermediate nodes of the various switch circuits.

The driver 440 in the upper right in the illustrated example is coupled to receive supply voltages Vdd_Lo (from an embodiment of the level shifter shown in FIG. 3) and Vss. Thus, the voltage swing of its output signal, Sel_VddLo may be less than the full voltage swing between Vdd and Vss. The driver 440 in the lower right in the example shown is coupled to receive supply voltages Vss_Hi and Vdd. Thus, its voltage swing may also be less than the full voltage swing between Vdd and Vss. The selection signals output from drivers corresponding to those on the right, Sel_VddLo and SelB_VssHi, are provided to pass gates in the transmission path (e.g., PG12 and PG2 of FIG. 2) of the various selection circuits. Control circuit 428 may generate control signals to cause one of the switch circuits to be selected by asserting the Sel_VddLo and SelB_VssHi signals at levels that cause activation of the receiving pass gates. These signals may be de-asserted for all unselected switch units, while control circuit 428 may cause assertion of Sel_Full and SelB_Full at those levels that cause activation of the third pass gate, PG3, of the unselected ones of the switch circuits.

Example IC

Figure 5:
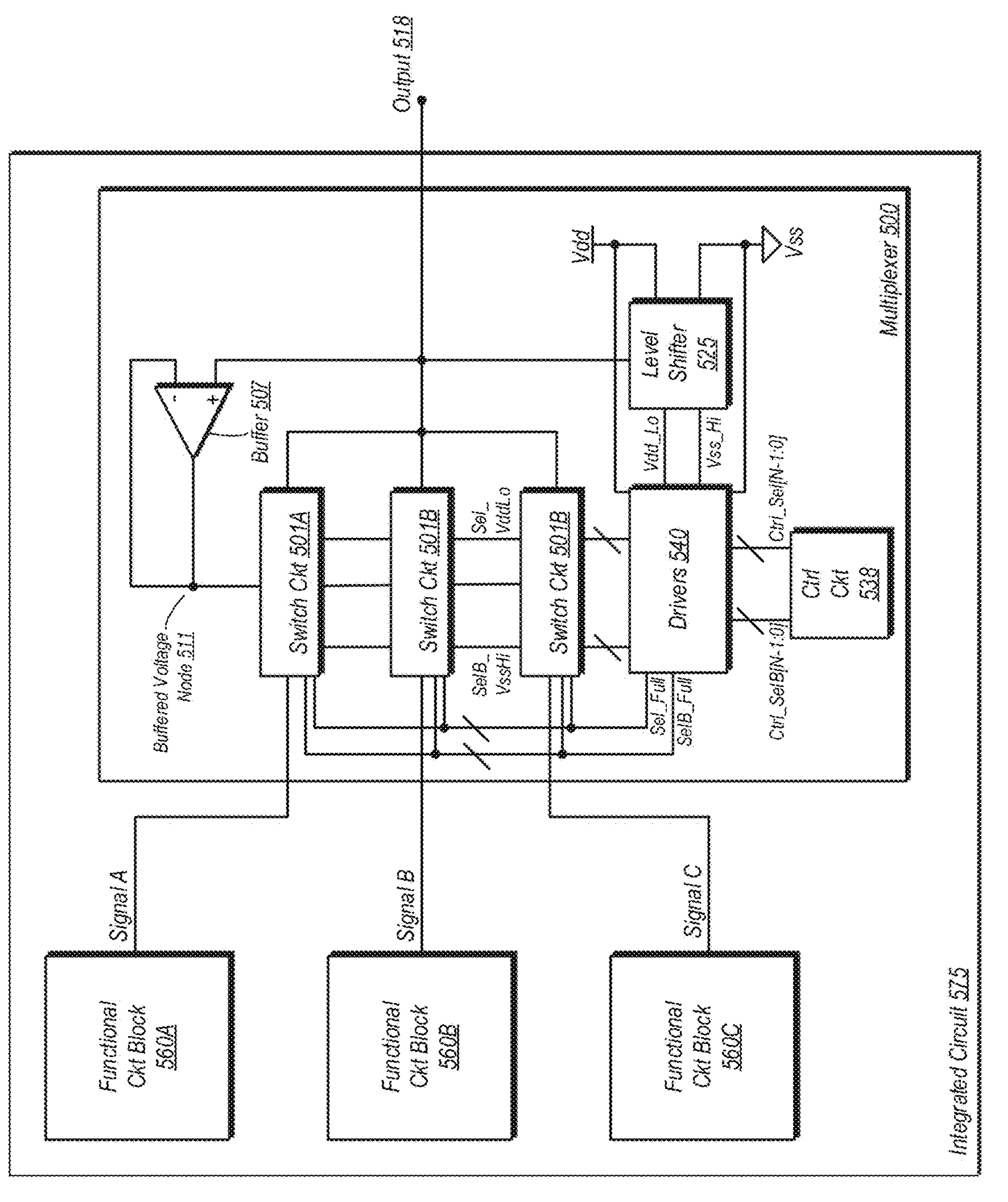
FIG. 5 is a block diagram illustrating an integrated circuit including one embodiment of a multiplexer according to the disclosure.

FIG. 5 is a block diagram illustrating an integrated circuit including one embodiment of a multiplexer according to the disclosure. It is noted that this embodiment of an IC is illustrated and is provided by way of example, but is not intended to limit the scope of the disclosure.

In the embodiment shown, IC 575 includes three functional circuit blocks 560 (560A, 560B, and 560C) which may generate various types of signals. In one embodiment, these functional blocks may include mixed signal circuitry, and may thus generate analog signals that undergo measurement during testing. Accordingly, Signals A, B, and C from functional circuit blocks 560A, 560B, and 560C, respectively, may be provided to a multiplexer 500. The use of multiplexer 500 enables access to each of these three signals while only using a single external connection of IC 575.

Multiplexer 500 in the embodiment shown may be a multiplexer according to the disclosure, including switch circuits 501A, 501B, and 501C. Each of these switch circuits is coupled to receive a corresponding one of Signals A, B, or C. Multiplexer 500 also includes a buffer 507 having a non-inverting input coupled to the output node 518, and an inverting node coupled in a feedback arrangement to buffered voltage node 511. The voltage generate on buffer voltage node 511 may be substantially the same as that of an output signal present on the output node 518.

Multiplexer 500 in the embodiment shown also includes a level shifter 525 configured to generate, using supply voltages Vdd and Vss and the voltage present on output node 518, supply voltages Vdd_Lo and Vss_Hi. Each of the supply voltages (Vdd, Vss, Vdd_Lo, and Vss_Hi) are provided to a driver unit 540, which may include a number of drivers such as those discussed above in reference to FIG. 4. These drivers may generate and provide the appropriate selection signals to the various switch circuits, based on control signals generated by control circuit 538, and in accordance with the operation described above with reference to FIGS. 1-4.

Although shown with three switch circuits here, the multiplexer of the present disclosure may be implemented with any suitable number of switch circuits (and thus, inputs). The proposed structure may see a significant benefit when a voltage level of the input signal is close to the supply or ground voltage, but can be used for any application where leakage is a concern, such as connections to high impedance nodes or multiplexing signals for on/off chip measurement.

Figure 6:
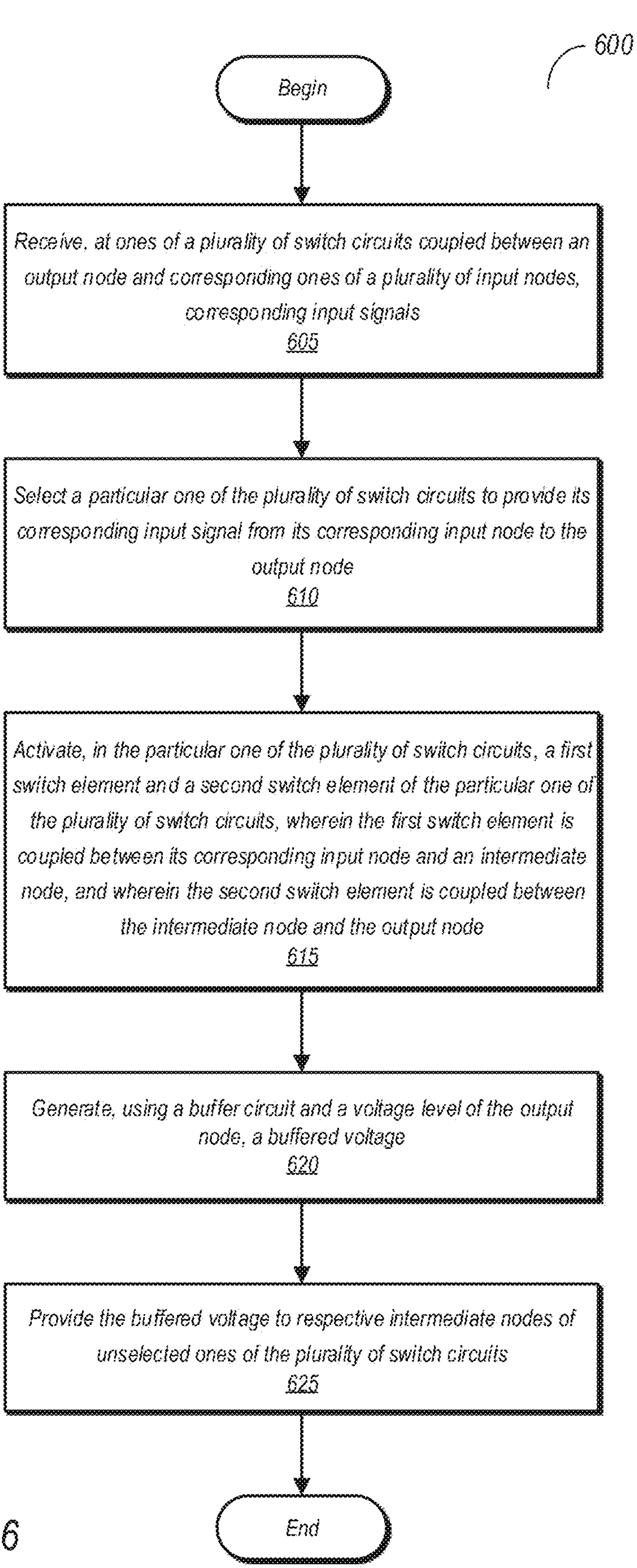
FIG. 6 is a flow diagram illustrating one embodiment of a method for operating a multiplexer according to the disclosure.

Methods for Operating a Multiplexer:

FIG. 6 is a flow diagram of one embodiment for operating a multiplexer according to the disclosure. Method 600 as described herein may be carried out by any embodiment of a multiplexer discussed above and as disclosed herein. Embodiments of a multiplexer capable of carrying out Method 600, but not otherwise disclosed herein, are also considered to fall within the scope of this disclosure.

Method 600 includes receiving, at ones of a plurality of switch circuits coupled between an output node and corresponding ones of a plurality of input nodes, corresponding input signals (block 605) and selecting a particular one of the plurality of switch circuits to provide its corresponding input signal from its corresponding input node to the output node (block 610). The method further includes activating, in the particular one of the plurality of switch circuits, a first switch element and a second switch element of the particular one of the plurality of switch circuits, wherein the first switch element is coupled between its corresponding input node and an intermediate node, and wherein the second switch element is coupled between the intermediate node and the output node (block 615). The method also includes generating, using a buffer circuit and a voltage level of the output node, a buffered voltage (block 620), and providing the buffered voltage to respective intermediate nodes of unselected ones of the plurality of switch circuits (block 625).

In various embodiments, the method activating a first switch element and a second switch element of the particular one of the plurality of switch circuits comprises activating a first pass gate and a second pass gate, respectively. Embodiments may further includes activating, in response to selection of a different one of the plurality of switch circuits, a third pass gate coupled between an output of the buffer circuit and the intermediate node of the particular one of the plurality of switch circuits.

Some embodiments of the method include generating, using a plurality of driver circuits, a corresponding plurality of selection signals, providing the plurality of selection signals to the plurality of switch circuits, and activating the particular one of the plurality of switch circuits in response to receiving at least one of the plurality of selection signals in an active state. Some of these embodiments may further include generating, using a control circuit, a plurality of control signals and generating, using the plurality of control signals and the plurality of driver circuits, the corresponding plurality of selection signals. These embodiments may further include receiving, at a level shifter circuit, first and second supply voltages and generating, using the level shifter circuit, third and fourth supply voltages, wherein a difference between the third and fourth supply voltages is less than a difference between the first and second supply voltages. With respect to the driver circuits, some embodiments include operating a first subset of the plurality of driver circuits using the first and second supply voltages and operating a second subset of the plurality of driver circuits using at least one of the third and fourth supply voltages.

Figure 7:
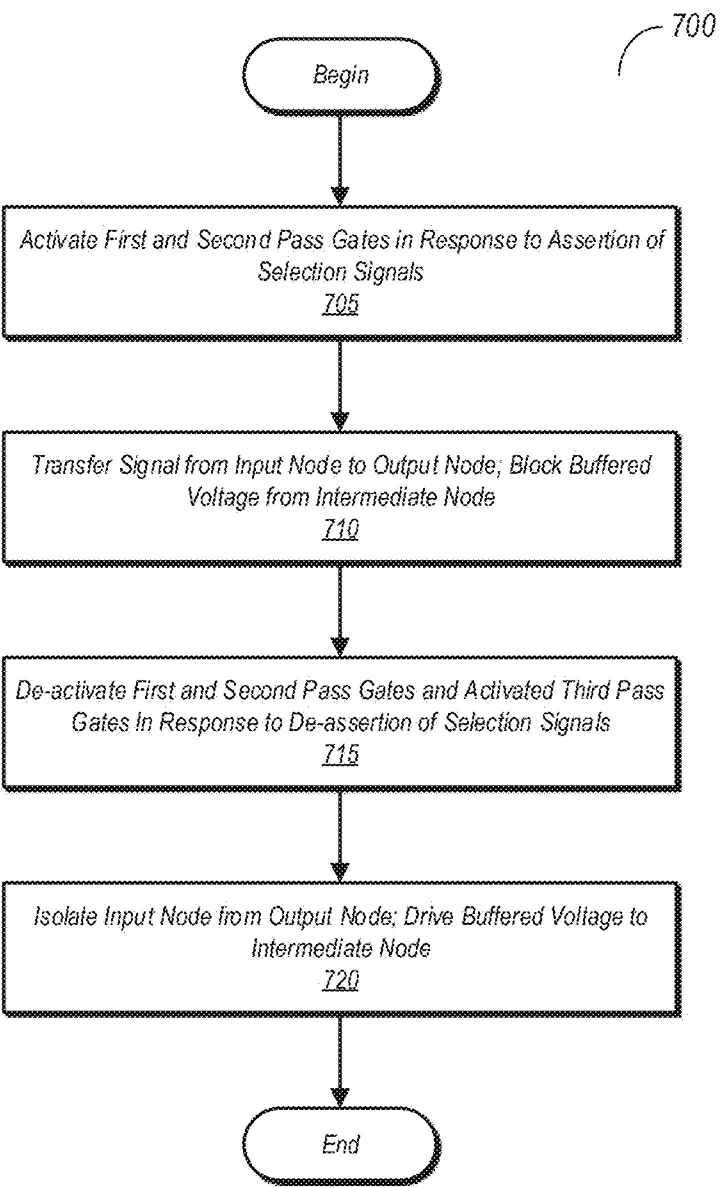
FIG. 7 is a flow diagram illustrating another embodiment of a method for operating a multiplexer according to the disclosure.

FIG. 7 is a flow diagram of another embodiment of a method for operating a multiplexer in accordance with this disclosure. Method 700 may be carried out by various embodiments of the multiplexer disclosed herein and as discussed above. Embodiments of a multiplexer capable of carrying out Method 700 but not otherwise disclosed herein are also considered to fall within the scope of this disclosure.

Method 700 includes, for a particular switch circuit of one embodiment of a multiplexer according to the disclosure, activating first and second pass gates in response to assertion of selection signals provided thereto (block 705). The first and second pass gates are coupled in series with one another, at an intermediate node and between a respective input node and an output node of the multiplexer.

The switch circuit whose operation is described by Method 700 also includes a third pass gate that is coupled between the intermediate node and an output of a buffer shared among all the switch circuits. The buffer includes a non-inverting terminal coupled to the output node of the multiplexer, and an inverting input coupled to the buffer output. Thus, with the feedback arrangement described here, the buffer generates a buffered voltage that is substantially the same as the voltage on the output node of the multiplexer. The output of the buffer may be connected to each of a number of third pass gates in each of the switch circuits of the multiplexer, including the third pass gate of the particular switch circuit whose operation is described by Method 700. The third pass gate is configured such that it remains inactive when the first and second pass gates are active. With the first and second pass gates active, the signal input to the particular switch circuit is transferred to the output node multiplexer, while the inactive third pass gate blocks the buffered voltage from an output of the buffer (block 710).

Method 700 further includes, for the particular switch circuit, deactivating the first and second pass gates and activating the third pass gate (block 715). Deactivating the first and second passgates while activating the third pass gate isolates the input node of the particular switch circuit from the output node of the multiplexer while also creating a path to drive the buffered voltage to the intermediate node (block 720). By driving the buffered voltage (which is substantially equal to the voltage on the output node of the multiplexer), leakage to the output node via the first and second pass gates may be effectively eliminated. Accordingly, the voltage present on the output node is not altered by leakage through the pass gates of unselected switch circuits.

To summarize, various embodiments of a multiplexer configured to prevent leakage from affecting a voltage on the output node is disclosed. The multiplexer includes a number of switch circuits, wherein each of the switch circuits includes a respective input node (coupled to receive an input signal), first and second switch elements coupled, at an intermediate node, in series between the respective input node and an output node of the multiplexer. Each switch circuit further includes a third switch element coupled between the intermediate node and an output of a buffer that is shared among the various switch circuits. The buffer is configured to generate a buffered voltage that may be effectively the same as the voltage present on the output node of the multiplexer. When a particular switch circuit is selected, its first and second switch elements are activated to create a path for its respectively received input signal to be conveyed to the output node, while its third switch element remains inactive. For the remaining, unselected switch circuits, their respective first and second switch elements are inactive while their respective third switch element is active. When the third switch element of a switch circuit is active, the buffered voltage is conveyed to its correspondingly coupled intermediate node. By driving the buffered voltage to the intermediate node of each of the unselected switch circuits, leakage from these circuits to the multiplexer output node may mitigated or effectively eliminated, thereby enabling the voltage of the output signal provided by the multiplexer to more accurately reflect the voltage of the input signal received by the selected switch circuit.

It is noted that while the circuits discussed above have been implemented using various types of NMOS and PMOS transistors, the disclosure is not intended to limit embodiments falling within its scope to these types of devices. Accordingly, in addition to the various types of devices discussed elsewhere herein, the present disclosure also contemplates embodiments that, e.g., use non-planar devices such as FinFETs, GAAFETs (Gate All Around FETs) and other types. Embodiments implemented using various types of bipolar devices are also possible and contemplated. The disclosure further contemplates the use of materials, technologies and devices that are speculative and/or not widely used as of this writing. These materials include graphene, carbon nanotubes, gallium arsenide, gallium nitride, silicon carbide, and so on, as well as devices and circuits implemented using these materials. The use of memristors in various circuit structures is also possible and contemplated.

Example Device

Figure 8:
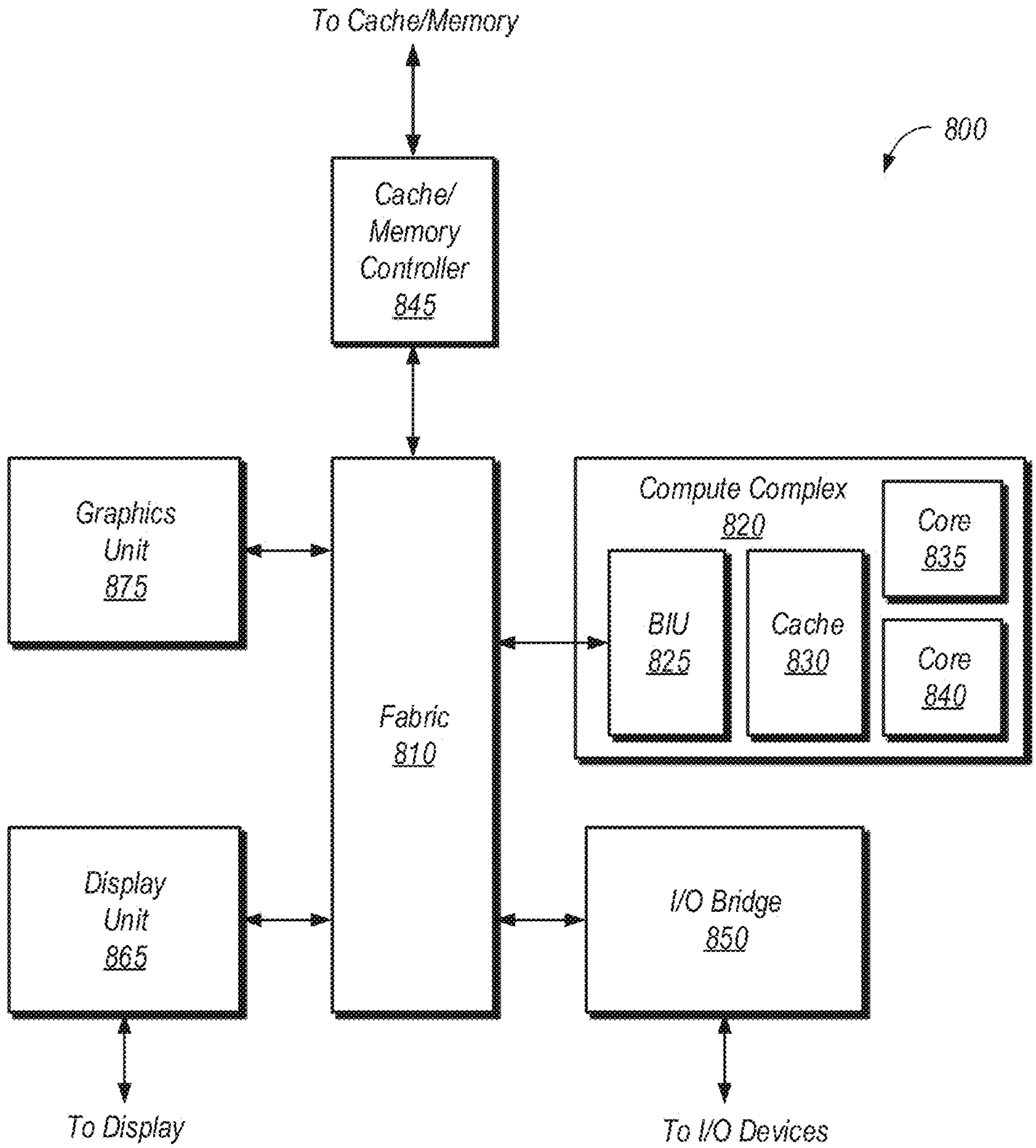
FIG. 8 is a block diagram of an embodiment of a device that includes a multiplexer according to the disclosure.

Referring now to FIG. 8, a block diagram illustrating an example embodiment of a device is shown. In various embodiments, device 800 may, in various circuits, implement functionality of the multiplexer of the present disclosure, such as that shown in FIG. 1. For example, the multiplexer of FIG. 1 may be coupled to convey test signals from various ones of the functional circuit blocks shown in FIG. 8 to an external pin of an IC upon which they are both implemented.

In some embodiments, elements of device 800 may be included within a system on a chip. In some embodiments, device 800 may be included in a mobile device, which may be battery-powered. Therefore, power consumption by device 800 may be an important design consideration. In the illustrated embodiment, device 800 includes fabric 810, compute complex 820, input/output (I/O) bridge 850, cache/memory controller 845, graphics unit 875, and display unit 865. In some embodiments, device 800 may include other components (not shown) in addition to, or in place of, the illustrated components, such as video processor encoders and decoders, image processing or recognition elements, computer vision elements, etc.

Fabric 810 may include various interconnects, buses, MUX's, controllers, etc., and may be configured to facilitate communication between various elements of device 800. In some embodiments, portions of fabric 810 may be configured to implement various different communication protocols. In other embodiments, fabric 810 may implement a single communication protocol, and elements coupled to fabric 810 may convert from the single communication protocol to other communication protocols internally.

In the illustrated embodiment, compute complex 820 includes bus interface unit (BIU) 825, cache 830, and cores 835 and 840. In various embodiments, compute complex 820 may include various numbers of processors, processor cores, and caches. For example, compute complex 820 may include 1, 2, or 4 processor cores, or any other suitable number. In one embodiment, cache 830 is a set associative L2 cache. In some embodiments, cores 835 and 840 may include internal instruction and data caches. In some embodiments, a coherency unit (not shown) in fabric 810, cache 830, or elsewhere in device 800, may be configured to maintain coherency between various caches of device 800. BIU 825 may be configured to manage communication between compute complex 820 and other elements of device 800. Processor cores, such as cores 835 and 840, may be configured to execute instructions of a particular instruction set architecture (ISA) which may include operating system instructions and user application instructions. These instructions may be stored in a computer readable medium such as a memory coupled to cache memory controller 845 as discussed below.

As used herein, the term "coupled to" may indicate one or more connections between elements, and a coupling may include intervening elements. For example, in FIG. 8, graphics unit 875 may be described as "coupled to" a memory through fabric 810 and cache/memory controller 845. In contrast, in the illustrated embodiment of FIG. 8, graphics unit 875 is "directly coupled" to fabric 810 because there are no intervening elements.

Cache/memory controller 845 may be configured to manage transfer of data between fabric 810 and one or more caches and memories. For example, cache/memory controller 845 may be coupled to an L3 cache, which may, in turn, be coupled to a system memory. In other embodiments, cache/memory controller 845 may be directly coupled to a memory. In some embodiments, cache/memory controller 845 may include one or more internal caches. Memory coupled to cache/memory controller 845 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 845 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 820 to cause the computing device to perform functionality described herein.

Graphics unit 875 may include one or more processors, e.g., one or more graphics processing units (GPUs). Graphics unit 875 may receive graphics-oriented instructions, such as OPENGL®, Metal®, or DIRECT3D® instructions, for example. Graphics unit 875 may execute specialized GPU instructions or perform other operations based on the received graphics-oriented instructions. Graphics unit 875 may generally be configured to process large blocks of data in parallel, and may build images in a frame buffer for output to a display, which may be included in the device or may be a separate device. Graphics unit 875 may include transform, lighting, triangle, and rendering engines in one or more graphics processing pipelines. Graphics unit 875 may output pixel information for display images. Graphics unit 875, in various embodiments, may include programmable shader circuitry which may include highly parallel execution cores configured to execute graphics programs, which may include pixel tasks, vertex tasks, and compute tasks (which may or may not be graphics-related).

Display unit 865 may be configured to read data from a frame buffer and provide a stream of pixel values for display. Display unit 865 may be configured as a display pipeline in some embodiments. Additionally, display unit 865 may be configured to blend multiple frames to produce an output frame. Further, display unit 865 may include one or more interfaces (e.g., MIPI® or embedded display port (eDP)) for coupling to a user display (e.g., a touchscreen or an external display).

I/O bridge 850 may include various elements configured to implement universal serial bus (USB) communications, security, audio, and low-power always-on functionality, for example. I/O bridge 850 may also include interfaces such as pulse-width modulation (PWM), general-purpose input/output (GPIO), serial peripheral interface (SPI), and inter-integrated circuit (I2C), for example. Various types of peripherals and devices may be coupled to device 800 via I/O bridge 850.

In some embodiments, device 800 includes network interface circuitry (not explicitly shown), which may be connected to fabric 810 or I/O bridge 850. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 800 with connectivity to various types of other devices and networks.

Example Systems

Figure 9:
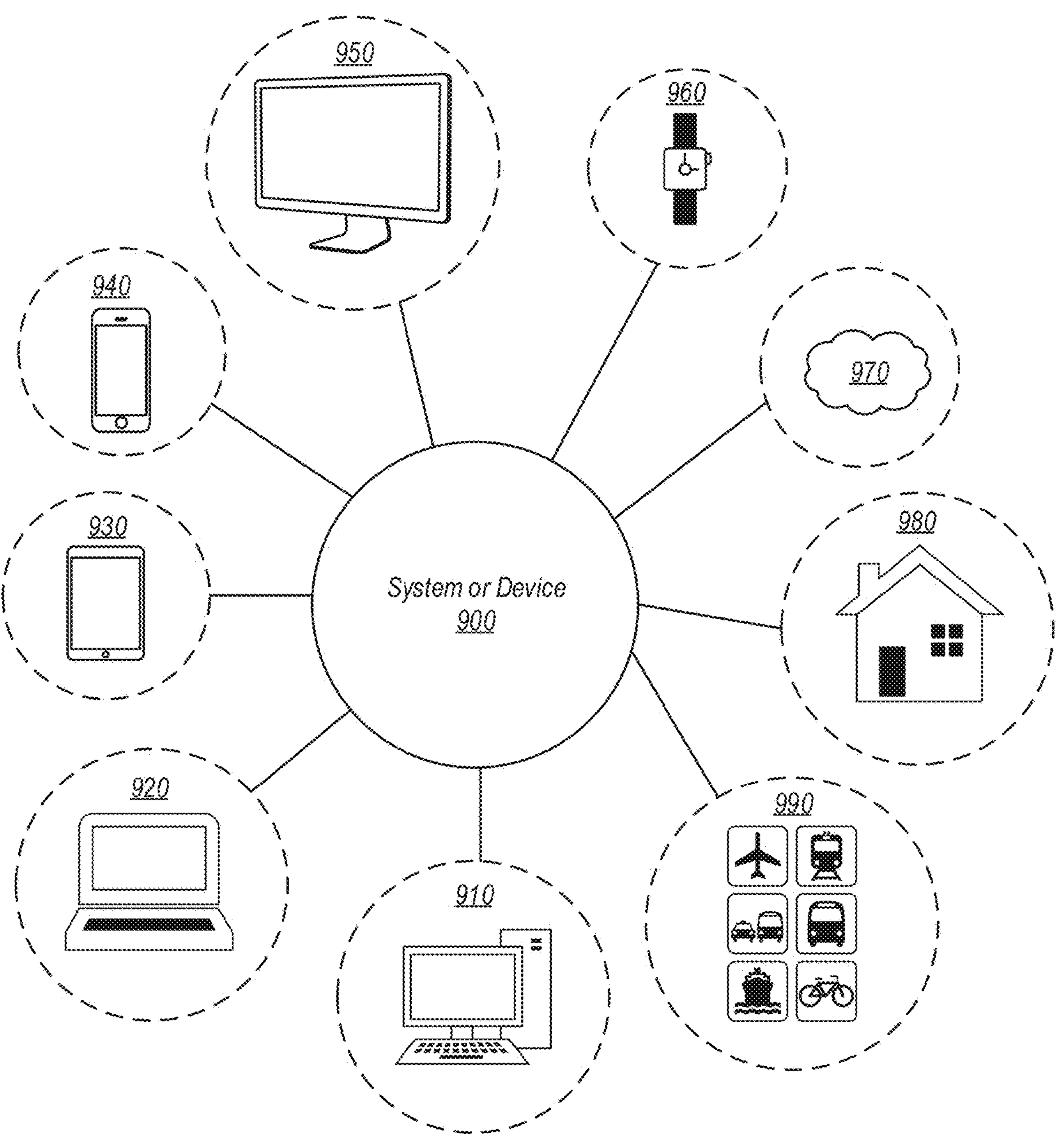
FIG. 9 is a block diagram of various embodiments of computer systems that may include a multiplexer according to the disclosure.

Turning now to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 10:
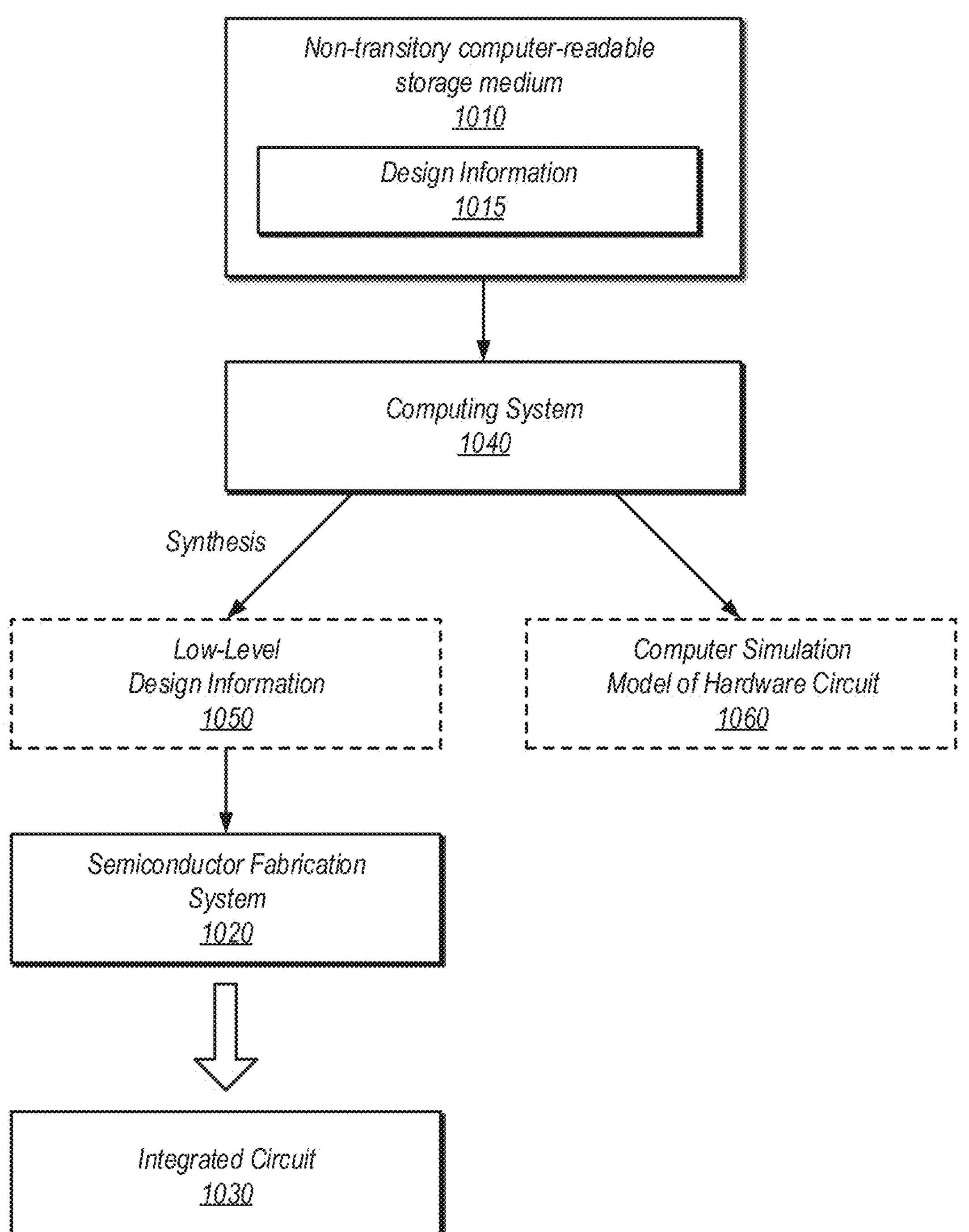
FIG. 10 illustrates an example of a non-transitory computer-readable storage medium that stores circuit design information.

Computer Readable Medium:

FIG. 10 is a block diagram illustrating an example of a non-transitory computer-readable storage medium that stores design information 1015, according to some embodiments. In the illustrated embodiment, computing system 1040 is configured to process design information 1015. This may include executing instructions included in design information 1015, interpreting instructions included in design information 1015, compiling, transforming, or otherwise updating design information 1015, etc. Therefore, design information 1015 controls computing system 1040 (e.g., by programming computing system 1040) to perform various operations discussed below, in some embodiments.

In the illustrated example, computing system 1040 processes design information 1015 to generate both computer simulation model of hardware circuit 1060 and low-level design information 1050. In other embodiments, computing system 1040 may generate only one of these outputs, may generate other outputs based on design information 1015, or both. Regarding computer simulation model of hardware circuit 1060, computing system 1040 may execute instructions of a hardware description language that includes register transfer level (RTL) code, behavioral code, structural code, or some combination thereof. The simulation model may perform the functionality specified by design information 1015, facilitate verification of the functional correctness of the hardware design, generate power consumption estimates, generate timing estimates, etc.

In the illustrated example, computing system 1040 also processes design information 1015 to generate low-level design information 1050 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 1050 (potentially among other inputs), semiconductor fabrication system 1020 is configured to fabricate integrated circuit 1030 (which may correspond to functionality of the computer simulation model of hardware circuit 1060). Note that computing system 1040 may generate different simulation models based on design information at various levels of description, including low-level design information 1050, design information 1015, and so on. The data representing low-level design information 1050 and computer simulation model of hardware circuit 1060 may be stored on non-transitory computer-readable storage medium 1010, or on one or more other media.

In some embodiments, low-level design information 1050 controls (e.g., programs) semiconductor fabrication system 1020 to fabricate integrated circuit 1030. Thus, when processed by the fabrication system, the design information may program the fabrication system to fabricate a circuit that includes various circuitry disclosed herein.

Non-transitory computer-readable storage medium 1010 may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1010 may include other types of non-transitory memory as well, or combinations thereof. Accordingly, non-transitory computer-readable storage medium 1010 may include two or more memory media, which may reside in different locations for example, in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. The format of various design information may be recognized by one or more applications executed by computing system 1040, semiconductor fabrication system 1020, or both. In some embodiments, design information 1015 may also include one or more cell libraries that specify the synthesis, layout, or both of integrated circuit 1030. In some embodiments, design information 1015 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 and computer simulation model of hardware circuit 1060 are configured to operate according to a circuit design specified by design information 1015, which may include performing any of the functionality described herein. For example, integrated circuit 1030 may include any of various elements shown in FIGS. 1-5. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 1015. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 1015 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 1050. Low-level design information 1050 may program semiconductor fabrication system 1020 to fabricate integrated circuit 1030.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus comprising:
- a plurality of switch circuits coupled between an output node and a plurality of input nodes; and
- a buffer circuit configured to generate a buffered voltage using a voltage level of the output node;
- wherein a first switch circuit of the plurality of switch circuits includes:
  - a first switch element configured to, in response to a selection of the first switch circuit, couple a corresponding input node of the plurality of input nodes to an intermediate node;
  - a second switch element configured to, in response to the selection of the first switch circuit, couple the intermediate node to the output node; and
  - a third switch element configured to, in response to a de-selection of the first switch circuit, couple the intermediate node to the buffered voltage; and
- a plurality of driver circuits including a first subset and a second subset, wherein driver circuits of the first subset are configured to generate and provide, to the second switch element, a first plurality of selection signals having a first voltage swing, and wherein driver circuits of the second subset are configured to generate and provide, to the first and third switch elements, a second plurality of selection signals having a second voltage swing, wherein the second voltage swing is less than the first voltage swing.

2. The apparatus of claim 1, wherein, for the first switch circuit, the first switch element comprises a first pass gate coupled between an input node and the intermediate node and the second switch element comprises a second pass gate coupled between the intermediate node and the output node, wherein, to select a given one of plurality of switch circuits, a control circuit is configured to cause activation of the first and second pass gates.

3. The apparatus of claim 2, wherein the third switch element of the first switch circuit comprises a third pass gate coupled between an output of the buffer circuit and the intermediate node, wherein the control circuit is further configured to activate the third pass gate and deactivate the first and second pass gates in response to selecting a different one of the plurality of switch circuits.

4. The apparatus of claim 1, wherein the buffer circuit comprises an output terminal, a non-inverting input coupled to the output node, and an inverting input coupled to an output terminal.

5. The apparatus of claim 1, further comprising a control circuit configured generate a plurality of control signals to cause one or more of the plurality of switch circuits to provide a signal received on its corresponding one of the plurality of input nodes to the output node.

6. The apparatus of claim 5, wherein driver circuits of a first subset of the plurality of driver circuits are configured to operate according to first and second supply voltages having a first potential difference, and wherein driver circuits of a second subset of the plurality of driver circuits are configured to operate according to at least one of a third supply voltage or a fourth supply voltage, wherein the third and fourth supply voltages have a second potential difference that is less than the first potential difference.

7. The apparatus of claim 6, further comprising a level-shifter circuit configured to generate the third and fourth supply voltages that track a selected input voltage using an output voltage provided on the output node and the first and second supply voltages.

8. The apparatus of claim 6, wherein, to select the first switch circuit, the control circuit is configured to cause the second subset of the plurality of driver circuits to assert corresponding selection signals to the first switch element and the second switch element.

9. The apparatus of claim 8, wherein, to deselect the first switch circuit, the control circuit is configured to cause the second subset of the plurality of driver circuits to de-assert the corresponding selection signals, and further configured to cause the first subset of driver circuits to assert corresponding selection signals to a passgate circuit to couple an output of the buffer circuit to the intermediate node.

10. A method comprising:
- receiving, at ones of a plurality of switch circuits coupled between an output node and corresponding ones of a plurality of input nodes, corresponding input signals;
- selecting a particular one of the plurality of switch circuits to provide its corresponding input signal from its corresponding input node to the output node;
- activating, in the particular one of the plurality of switch circuits, a first switch element and a second switch element of the particular one of the plurality of switch circuits, wherein the first switch element is coupled between its corresponding input node and an intermediate node, and wherein the second switch element is coupled between the intermediate node and the output node;
- generating, using a buffer circuit and a voltage level of the output node, a buffered voltage; and
- providing the buffered voltage to respective intermediate nodes of unselected ones of the plurality of switch circuits;
- wherein activating the first and second switch elements of the particular one of the plurality of switch circuits comprises generating and providing, by a first subset of a plurality of driver circuits and to the first and second switch elements, a first plurality of selection signals having a first voltage swing; and wherein providing the buffered voltage to respective intermediate nodes of unselected ones of the plurality of switch circuits comprises generating and providing, by a second subset of a plurality of driver circuits and to a third switch element of the unselected ones of the plurality of switch circuits, a second plurality of selection signals having a second voltage swing different from the first voltage swing.

11. The method of claim 10, wherein activating a first switch element and a second switch element of the particular one of the plurality of switch circuits comprises activating a first pass gate and a second pass gate, respectively.

12. The method of claim 11, wherein activating a third switch element of the unselected ones of the plurality of switch circuits comprises activating a third pass gate coupled between an output of the buffer circuit and the intermediate node of the particular one of the plurality of switch circuits.

13. The method of claim 10, further comprising:

activating the particular one or more of the plurality of switch circuits in response to receiving at least one of the plurality of selection signals in an active state.

14. The method of claim 13, further comprising:

generating, using a control circuit, a plurality of control signals; and generating, using the plurality of control signals and the plurality of driver circuits, the corresponding plurality of selection signals.

15. The method of claim 13, further comprising:

receiving, at a level shifter circuit, first and second supply voltages; and generating, using the level shifter circuit, third and fourth supply voltages, wherein a difference between the third and fourth supply voltages is less than a difference between the first and second supply voltages.

16. The method of claim 15, further comprising:

operating the first subset of the plurality of driver circuits using the first and second supply voltages; and operating the second subset of the plurality of driver circuits using at least one of the third and fourth supply voltages.

17. A system comprising:

a plurality of functional circuit blocks, wherein two or more of the plurality of functional circuit blocks are configured to generate corresponding ones of a plurality of test signals;

a multiplexer configured to provide a selected one of the plurality of test signals to an output node; and a buffer circuit configured to generate a buffered voltage using a voltage level of the output node;

wherein the multiplexer comprises a plurality of switch circuits coupled between respective ones of a plurality of input nodes and the output node, wherein a first switch circuit includes:

a first pass gate coupled between a respective one of the plurality of input nodes and an intermediate node;

a second pass gate coupled between the intermediate node and the output node; and a third pass gate coupled between an output of the buffer circuit and the intermediate node; and a plurality of driver circuits including a first subset and a second subset, wherein driver circuits of the first subset are configured to generate and provide, to the third switch pass gates of ones of the plurality of switch circuits, a first plurality of selection signals having a first voltage swing, and wherein driver circuits of the second subset are configured to generate and provide, to the third pass gates of the plurality of switch circuits, a second plurality of selection signals having a second voltage swing, wherein the second voltage swing is less than the first voltage swing;

wherein, when selected, the first switch circuit is configured to activate the first and second pass gates and de-activate the third pass gate, and wherein, when a different one of the plurality of switch circuits is selected, the first switch circuit is configured to de-activate the first and second pass gates and activate the third pass gate.

18. The system of claim 17, wherein ones of the first subset of the plurality of driver circuits are configured to operate using first and second supply voltages and wherein ones of the second subset of the plurality of driver circuits are configured to operate using at least one of third and fourth supply voltages; and wherein the multiplexer further includes a level shifter circuit configured to generate the third and fourth supply voltages using the first and second supply voltages, wherein a difference between the third and fourth supply voltages is less than a difference between the first and second supply voltages.

19. The apparatus of claim 8, wherein the level-shifter circuit includes:

a first current mirror configured to generate a first mirrored current;

a first circuit branch configured to generate, based on the first mirrored current and a signal on the output node, the third supply voltage;

a second current mirror configured to generate a second mirrored current; and a second circuit branch configured to generate, based on the second mirrored current and the signal on the output node, the fourth supply voltage.

20. The system of claim 18, wherein the level-shifter circuit includes:

a first current mirror configured to generate a first mirrored current;

a first circuit branch configured to generate, based on the first mirrored current and a signal on the output node, the third supply voltage;

a second current mirror configured to generate a second mirrored current; and a second circuit branch configured to generate, based on the second mirrored current and the signal on the output node, the fourth supply voltage.

* * * * *